(12) United States Patent
Abdelrahaman et al.

(10) Patent No.: US 11,706,924 B2
(45) Date of Patent: Jul. 18, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Ramey M. Abdelrahaman, Boise, ID (US); Jeslin J. Wu, Boise, ID (US); Chandra Tiwari, Boise, ID (US); Kunal Shrotri, Boise, ID (US); Swapnil Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/718,863

(22) Filed: Apr. 12, 2022

(65) Prior Publication Data

US 2022/0238553 A1    Jul. 28, 2022

Related U.S. Application Data

(62) Division of application No. 16/902,897, filed on Jun. 16, 2020, now Pat. No. 11,329,064.

(51) Int. Cl.
*H10B 43/27* (2023.01)
*H01L 21/311* (2006.01)
(Continued)

(52) U.S. Cl.
CPC ........... *H10B 43/27* (2023.02); *H01L 21/022* (2013.01); *H01L 21/0217* (2013.01); *H01L 21/02164* (2013.01); *H01L 21/3115* (2013.01); *H01L 21/31111* (2013.01); *H10B 41/27* (2023.02); *H10B 41/35* (2023.02); *H10B 43/35* (2023.02)

(58) Field of Classification Search
CPC . H01L 27/1158; H01L 21/3115; H01L 27/115
See application file for complete search history.

(56) References Cited

U.S. PATENT DOCUMENTS 9,287,290 B1     3/2016   Rabkin
10,297,611 B1 *  5/2019   Wells ............... H01L 29/7926
(Continued)

FOREIGN PATENT DOCUMENTS

| WO | WO 2017/040518 A1 | 3/2017 |
| WO | WO PCTUS2021-035417 | 9/2021 |
| WO | WO PCT/US2021/035417 | 12/2022 |

OTHER PUBLICATIONS

Bouchoule et al., "Sidewall passivation assisted by silicon coverplate during Cl2-H2 and HBr inductively coupled plasma etching of InP for photonic devices", American Vacuum Society, United States, Apr. 2008, pp. 666-674.

*Primary Examiner* — Mounir S Amer
(74) *Attorney, Agent, or Firm* — Wells St. John P.S.

(57) ABSTRACT

Some embodiments include an integrated assembly having a vertical stack of alternating insulative levels and conductive levels. The insulative levels have a same primary composition as one another. At least one of the insulative levels is compositionally different relative to others of the insulative levels due to said at least one of the insulative levels including dopant dispersed within the primary composition. An opening extends vertically through the stack. Some embodiments include methods of forming integrated assemblies.

10 Claims, 12 Drawing Sheets

(51) Int. Cl.
*H01L 21/02* (2006.01)
*H01L 21/3115* (2006.01)
*H10B 41/27* (2023.01)
*H10B 41/35* (2023.01)
*H10B 43/35* (2023.01)

(56) References Cited

U.S. PATENT DOCUMENTS

| | | | |
|---|---|---|---|
| 10,892,267 B2 | 1/2021 | Mushiga | |
| 11,411,118 B2 * | 8/2022 | Pulugurtha | H01L 29/78642 |
| 2014/0273462 A1 | 9/2014 | Simsek-Ege | |
| 2018/0204849 A1 * | 7/2018 | Carlson | H01L 29/40117 |
| 2019/0206723 A1 | 7/2019 | Tokashiki | |

* cited by examiner

INTEGRATED ASSEMBLIES AND METHODS OF FORMING INTEGRATED ASSEMBLIES

RELATED PATENT DATA

This patent resulted from divisional application of U.S. patent application Ser. No. 16/902,897, filed Jun. 16, 2020, the disclosures of which are incorporated herein by reference.

TECHNICAL FIELD

Integrated assemblies (e.g., integrated memory). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals AO through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the AO through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_J$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

DETAILED DESCRIPTION OF THE ILLUSTRATED EMBODIMENTS

Some embodiments include methods of forming one or more openings through a stack of alternating materials. Dopant may be dispersed within some regions of the materials to alter etch characteristics of such regions and to thereby improve the configurations of the openings (e.g., to reduce tapers, constrictions, dilations, etc., that may otherwise be present within the openings). The term "dopant" refers to impurity provided within a principle (primary) composition. The impurity may comprise a single species, or may comprise a collection of two or more species. Example embodiments are described with reference to FIGS. 5-15.

Figure 1:
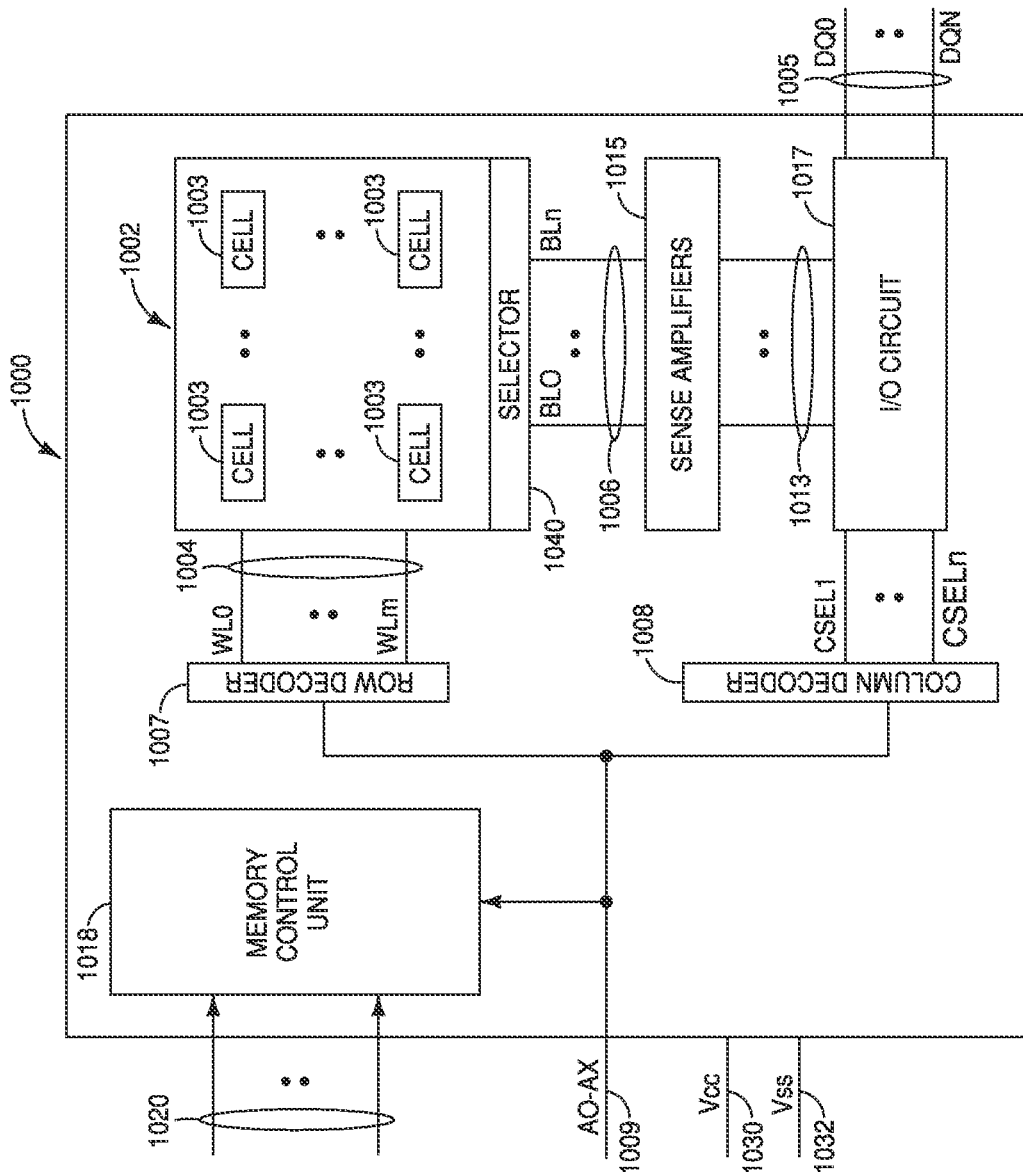
FIG. 1 shows a block diagram of a prior art memory device having a memory array with memory cells.
Figure 2:
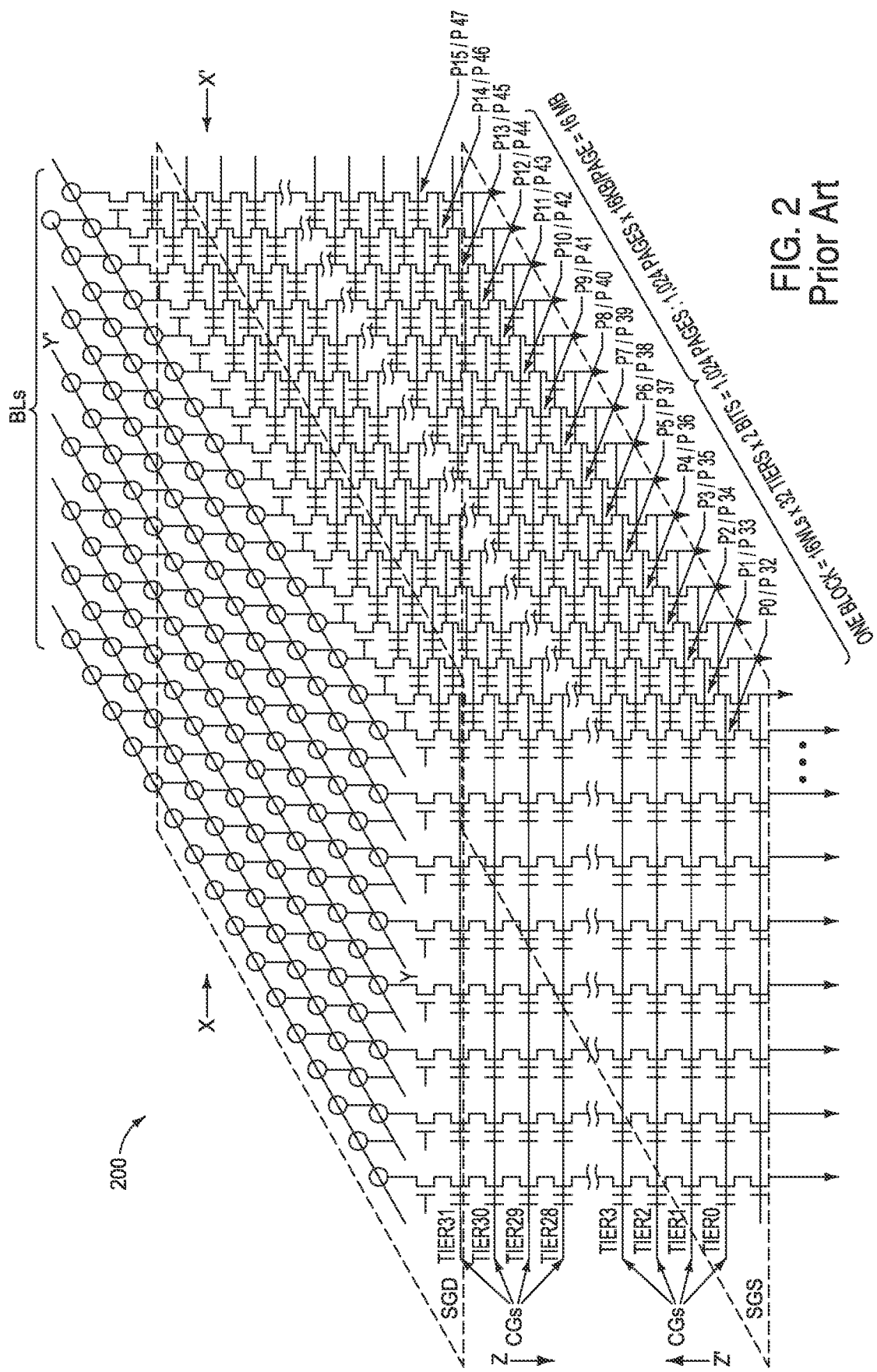
FIG. 2 shows a schematic diagram of the prior art memory array of FIG. 1 in the form of a 3D NAND memory device.
Figure 3:
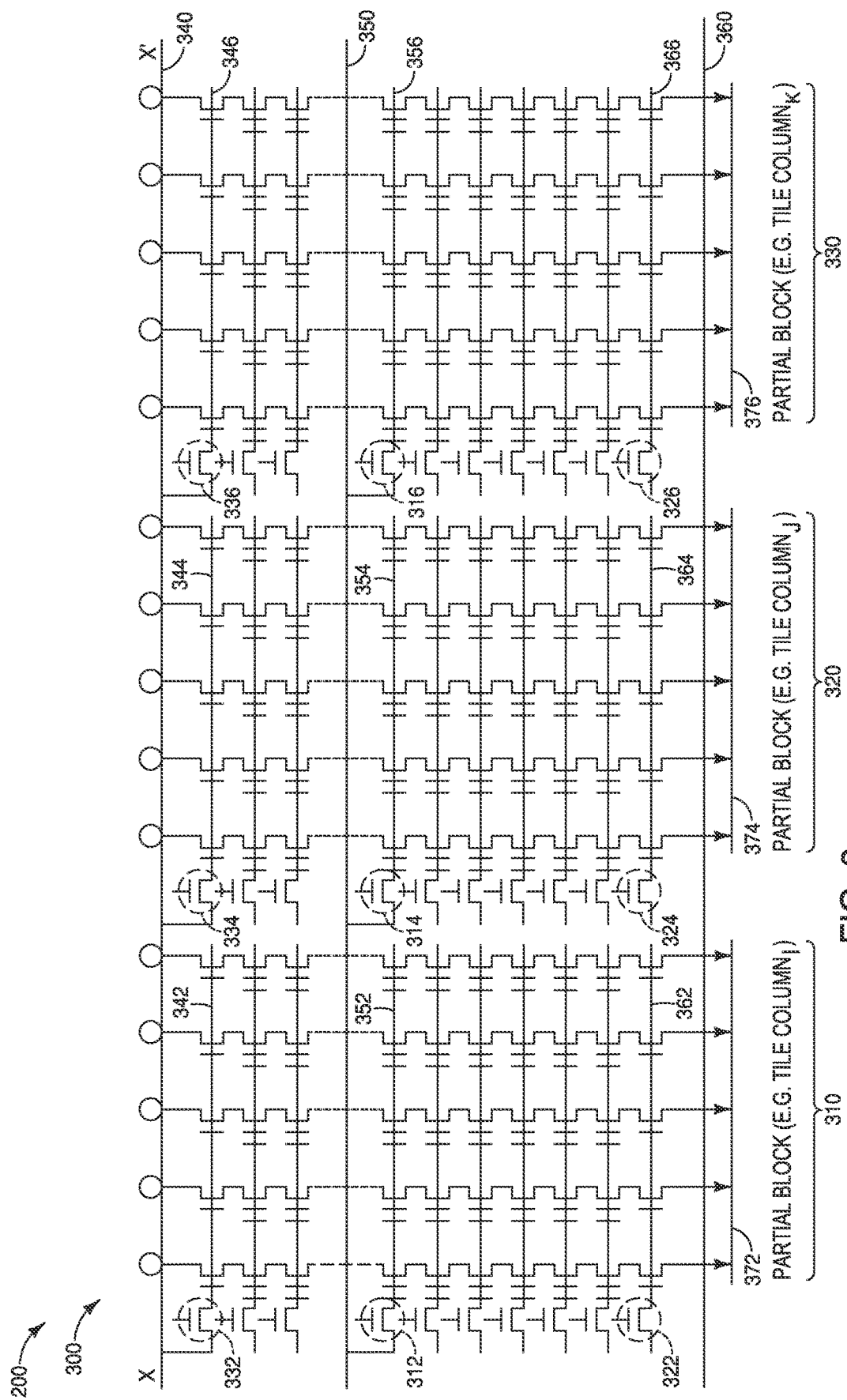
FIG. 3 shows a cross-sectional view of the prior art 3D NAND memory device of FIG. 2 in an X-X' direction.
Figure 4:
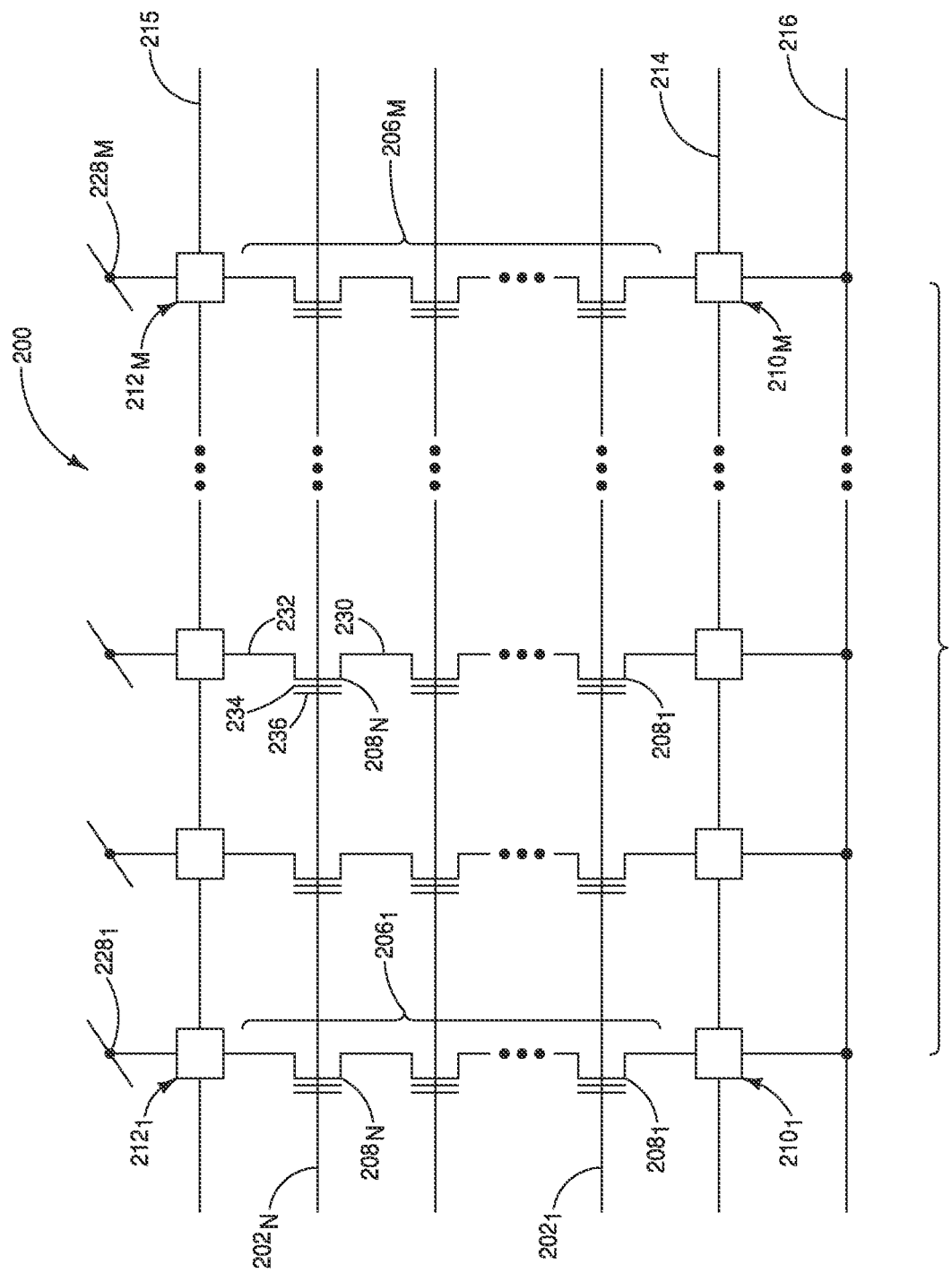
FIG. 4 is a schematic diagram of a prior art NAND memory array.
Figure 5:
FIG. 5 is a diagrammatic cross-sectional side view of an example assembly.

Referring to FIG. 5, an integrated assembly 10 includes a stack 12 comprising a pair of levels 14 and 16. The level 14 includes a first material 18, and the level 16 includes a second material 20. The materials 18 and 20 are of different compositions relative to one another. In some embodiments, the material 18 may comprise, consist essentially of, or consist of silicon dioxide, and the material 20 may comprise, consist essentially of, or consist of silicon nitride.

Figure 6:
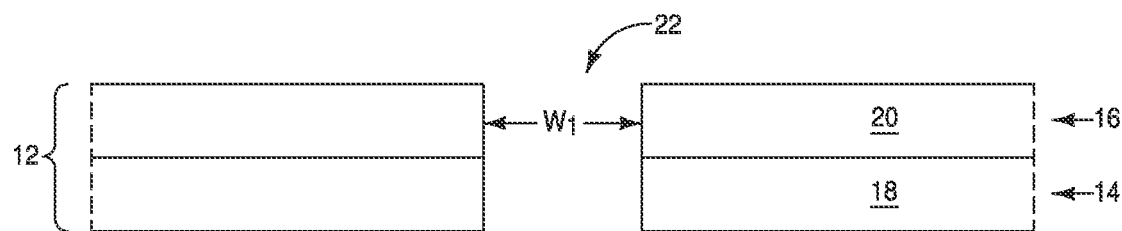
FIGS. 6-8 are diagrammatic cross-sectional side views of the example assembly of FIG. 5 at process stages subsequent to that of FIG. 5.

Referring to FIG. 6, an opening 22 is formed to extend through the stack 12. The opening 22 may be formed with any suitable etch(es), such as, for example, plasma (dry) etching utilizing fluorine, wet etching utilizing hydrofluoric acid, etc. Another example wet etch may, for example, use conditions analogous to those of standard clean 1 (SC1), with such conditions utilizing ammonium hydroxide and hydrogen peroxide.

The opening 22 may have any suitable configuration when viewed from above, and may be, for example, circular, rectangular, elliptical, etc.

Figure 7:
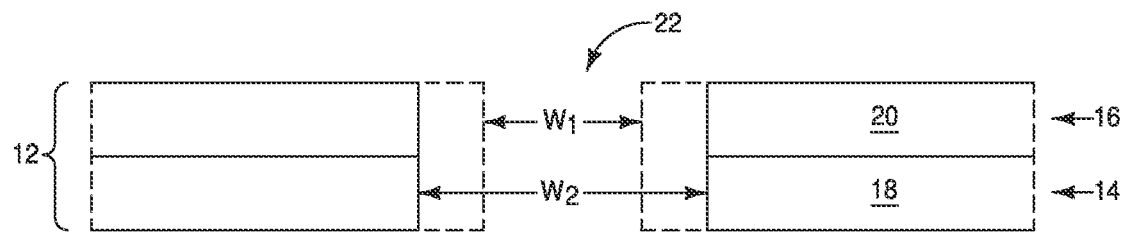
Figure 8:
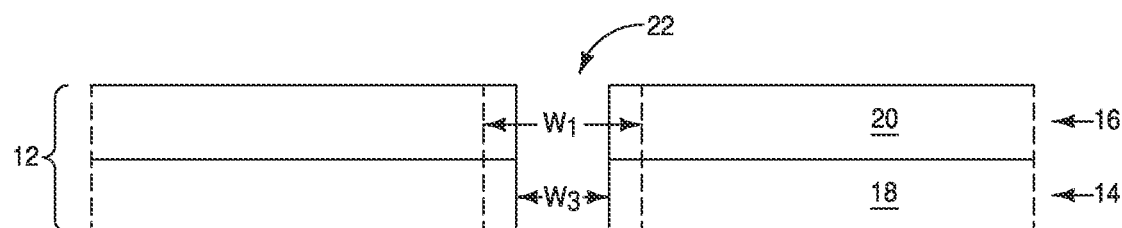

The opening 22 has a width $W_1$ along the cross-section of FIG. 6. Some embodiments described herein utilize dopant within the materials 18 and 20 to alter the width of the opening 22. FIGS. 7 and 8 illustrate example applications in which the width is expanded (FIG. 7) and contracted (FIG. 8) through the incorporation of appropriate dopant into the materials 18 and 20.

Referring to FIG. 7, dopant is incorporated into the materials 18 and 20 to enhance a rate of removal of the materials during the etching process, and to thereby widen the opening 22. Specifically, the opening 22 is now at a width $W_2$ which is greater than the width $W_1$. The opening 22 of FIG. 7 may be formed under the same conditions as those utilized to form the opening 22 of FIG. 6, but the opening ends up wider due to the dopant which has been incorporated into the materials 18 and 20.

Referring to FIG. 8, dopant is incorporated into the materials 18 and 20 to reduce a rate of removal of the materials during the etching process, and to thereby narrow the opening 22. Specifically, the opening 22 is now at a width $W_3$ which is less than the width $W_1$. The opening 22 of FIG. 8 may be formed under the same conditions as those utilized to form the opening 22 of FIG. 6, but the opening ends up narrower due to the dopant which has been incorporated into the materials 18 and 20.

The dopant utilized for the processing of FIGS. 7 and 8 may include one or more elements selected from Groups 13-16 of the Periodic Table, and in some embodiments may include one or more species selected from the group consisting of Al, Ga, Ge, C, Se, S, Sn, Te, P, As and Sb. In particular embodiments, the dopant may include the carbon in the form of one or more fluorocarbons. The dopant may be provided to any suitable concentration. For instance, the dopant may be dispersed within the materials 18 and 20 to a concentration of at least about 0.01 atomic percent (at %). In some embodiments, the dopant may be present within the materials 18 and 20 to concentration within a range of from about 0.01 at % to about 1 at %, or to a concentration within a range of from about 0.01 at % to about 5 at %.

The dopant within the material 18 may or may not be the same as the dopant within the material 20. In some embodiments the same dopant is within materials 18 and 20, and is utilized to either enhance formation of a polymer buildup along sidewall edges of the materials adjacent the opening 22, or to reduce formation of the polymer buildup. Enhanced formation of the polymer buildup may reduce a rate of etching of the materials 18 and 20, and may thereby result in formation of a narrower opening 22 (i.e., the opening of FIG. 8). In contrast, reduction of the formation of the polymer buildup may lead to an enhanced rate of etching of the materials 18 and 20, and may thereby result in formation of a wider opening 22 (i.e., the opening of FIG. 7).

Example dopant species which may promote buildup of polymer are sulfur, silicon, etc. Example dopant species which may inhibit buildup of polymer are nitrogen, oxygen, etc.

The polymer buildup mechanism is provided to assist the reader in understanding some of the embodiments described herein and is not to limit this disclosure or the claims that follow except to the extent, if any, that such mechanism is expressly recited in the claims. The dopant(s) may alter the etch rates of the materials 18 and 20 through other mechanisms in addition to, or alternatively to, influencing the rate of polymer buildup. Such other mechanisms may include, for example, hardening or softening one or both of the materials 18 and 20 relative to the etch conditions.

The methodology of FIGS. 5-8 may be utilized to improve the configuration of an opening formed through a large vertical stack of alternating materials as described with reference to FIGS. 9-11.

Figure 9:
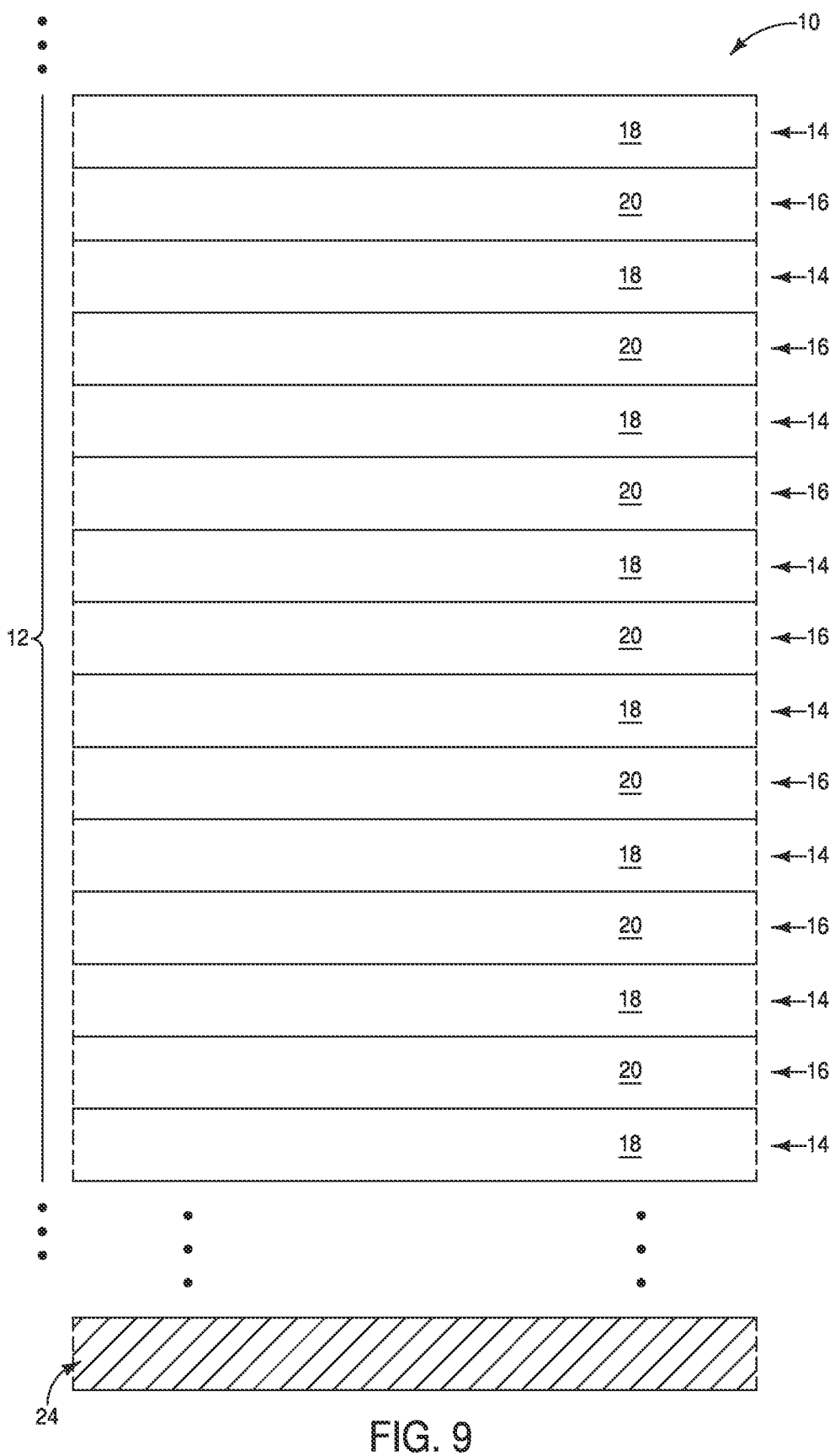
FIG. 9 is a diagrammatic cross-sectional side view of an example integrated assembly.

FIG. 9 shows an assembly 10 which includes a stack 12 of alternating first and second levels 14 and 16. The first levels 14 comprise the first material 18 and the second levels 16 comprise the second material 20. The first material 18 may be considered to comprise a first primary composition and the second material 20 may be considered to comprise a second primary composition which is different from the first primary composition. The term "primary composition" refers to a composition excluding any dopant which may be present in the material. For instance, the primary compositions of the materials 18 and 20 may be SiO and SiN, respectively, where the chemical formulas indicate primary constituents rather than specific stoichiometries. In some embodiments, the primary composition of the material 18 may be $SiO_2$, and the primary composition of the material 20 may be $Si_3N_4$.

The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have vertical thicknesses within a range of from about 10 nm to about 50 nm. In some embodiments, the first and second levels 14 and 16 may have vertical thicknesses within a range of from about 15 nm to about 40 nm, within a range of from about 15 nm to about 20 nm, etc. There may be any suitable number of levels 14 and 16 within the stack 12, In some embodiments, there may be more than 10 of the levels within the stack, more than 50 of the levels within the stack, more than 100 of the levels within the stack, etc.

In the shown embodiment, the stack 12 is supported over a conductive structure 24. The conductive structure 24 may correspond to a source structure analogous to the source structures 214 and/or 360 described with reference to FIGS. 1-4, and may be a line, an expanse, or any other suitable configuration. The source structure 24 may comprise any suitable materials, and in some applications may comprise conductively-doped semiconductor material (e.g., conductively-doped silicon) over metal-containing material (e.g., tungsten silicide).

The source structure 24 may be supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the stack 12 and the source structure 24. The gap is utilized to indicate that other components and materials may be provided between the stack 12 and the source structure 24. Such other components and materials may comprise additional levels of the stack, source-side select gates (SGSs), etc.

Figure 10:
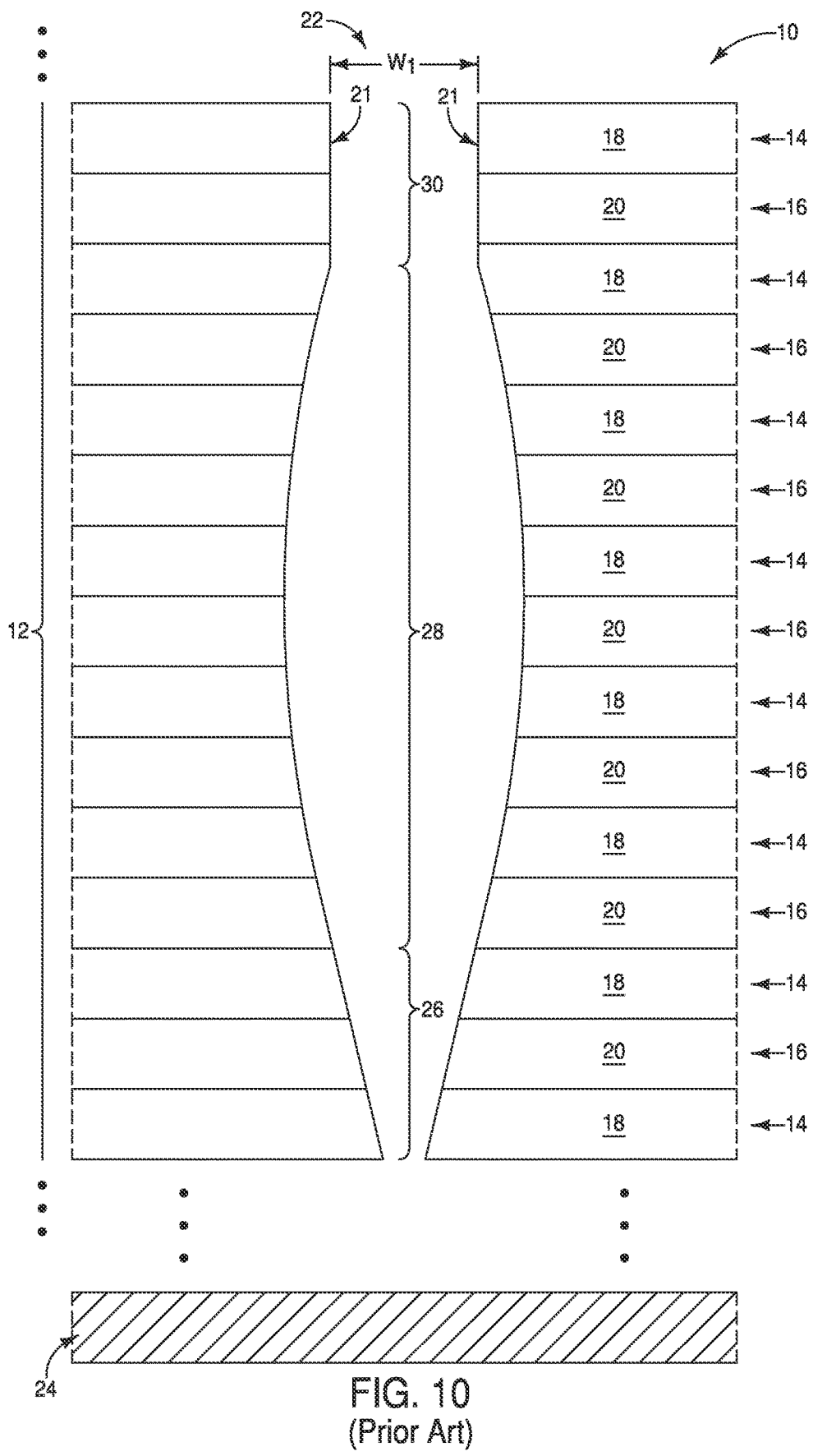
FIG. 10 is a diagrammatic cross-sectional side view of the example assembly of FIG. 9 at a prior art process stage subsequent to that of FIG. 9.

Referring to FIG. 10, the opening 22 is formed to extend through the stack 12 with a prior art etch process. The prior art process may be a plasma etch, a wet etch, etc. The illustrated opening 22 may be representative of a plurality of openings formed through the stack 12, with such openings intended to be substantially identical to one another.

The opening 22 has undulating sidewalls along the cross-section of FIG. 10 due to the etch removing some regions of the materials 18 and 20 faster than others. For instance, in the illustrated application the opening 22 may be considered to have a bottom region 26, a central region 28 and an upper region 30. The upper region 30 has the width $W_1$ which is desired. The bottom region 26 is tapered, and is narrower than the desired width; and the central region 28 is outwardly bowed, and is wider than the desired width. The illustrated opening 22 of FIG. 10 may be problematic for intended applications in that the opening is wider than the desired dimension $W_1$ which may make the opening too wide for intended levels of integration, and in that the varying dimensions along the opening may render it difficult, if not impossible, to form a plurality of such openings with intended uniformity across the openings.

Figure 11:
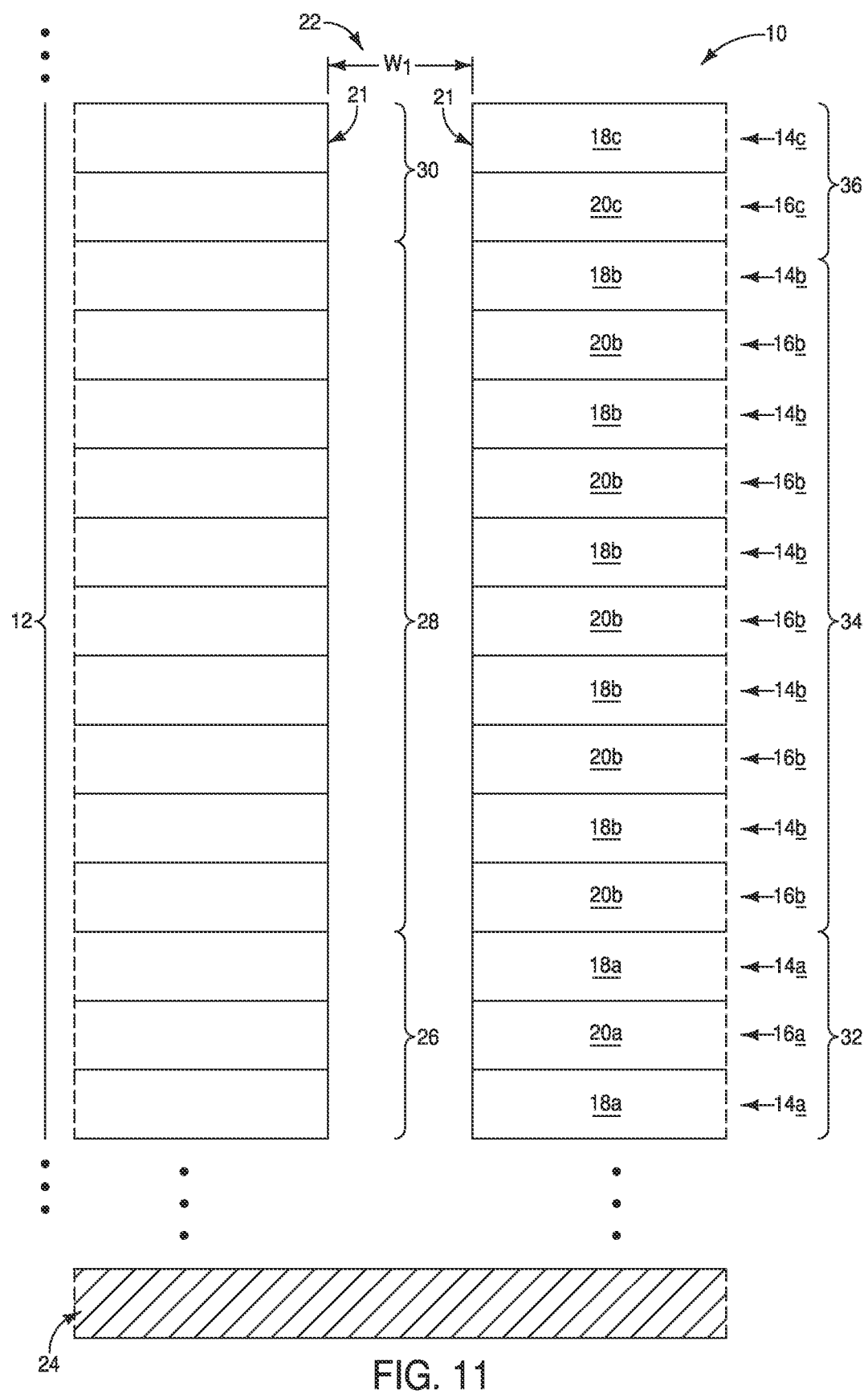
FIGS. 11-14 are diagrammatic cross-sectional side views of the example assembly of FIG. 9 at example sequential process stages of an example method.

FIG. 11 shows the stack 12 modified to alleviate the problematic varying dimensions of the opening 22 of FIG. 10. Specifically, the stack 12 is subdivided into three regions 32, 34 and 36, with each of the regions being adjusted to achieve a desired etch rate so that the opening 22 may be formed to have a uniform width $W_1$ from the top of the stack 12 to the bottom of the stack (i.e., so that the sidewalls 21 may be formed to be substantially vertically straight).

The materials 18 and 20 are shown to have different compositions within the regions 32, 34 and 36. Specifically, the materials 18 and 20 have compositions corresponding to 18a and 20a within the lower region 32, compositions corresponding to 18b and 20b within the middle region 34, and compositions corresponding to 18c and 20c within the upper region 36. The substances 18a, 18b and 18c may all have the same first primary composition as one another, but may differ from one another relative to dopant(s) which may or may not be dispersed within such substances. Similarly, the substances 20a, 20b and 20c may all have the same second primary composition as one another, but may differ from one another relative to dopant(s) which may or may not be dispersed within such substances. The substances 18a and 20a are shown to be formed within lower levels 14a and 16a, the substances 18b and 20b are shown to be formed within middle levels 14b and 16b, and the substances 18c and 20c are shown to be formed within upper levels 14c and 16c.

In some embodiments, the substances 18c and 20c may correspond to the first and second primary compositions, and may have little, if any, dopant therein. For instance, in some embodiments the substances 18c and 20c may correspond to (i.e., may consist essentially of, or consist of) $SiO_2$ and $Si_3N_4$, respectively.

The substances 18a and 20a may correspond to the first and second primary compositions, and may further include dopant(s) therein which enable(s) the lower levels 14a and 16a to etch faster during the formation of the opening 22 than do the levels 14b, 16b, 14c and 16c. Such dopant(s) may render the substances 18a and 20a within the lower levels to be softer than the substances 18b, 18c, 20b and 20c within the upper levels (i.e., to etch faster than the substances within the upper levels), and/or may reduce a rate of polymer buildup along the sidewalls 21 adjacent the levels 14a and 16a during the formation of the opening 22. In some embodiments, the dopant(s) provided within the substances 18a and 20a may include one or more of nitrogen, oxygen, etc. If the substance 18a comprises $SiO_x$ (where x is a number), and the dopant comprises oxygen, then the oxygen concentration within the substance 18a may be greater than the oxygen concentration within stoichiometric silicon dioxide (i.e., the substance 18a may comprise $SiO_x$, where x is greater than 2). If the substance 20a comprises silicon nitride, and the dopant comprises nitrogen, then the nitrogen concentration within the substance 20a may be greater than the nitrogen concentration within stoichiometric silicon nitride (i.e., greater than the nitrogen concentration within $Si_3N_4$).

The substances 18b and 20b may correspond to the first and second primary compositions, and may further include dopant(s) therein which enable(s) the central levels 14b and 16b to etch slower during the formation of opening 22 than do the levels 14a, 16a, 14c and 16c. Such dopant(s) may render the substances 18b and 20b within the central levels to be harder than the substances 18a, 18c, 20a and 20c within the other levels (i.e., to etch slower than the substances within the other levels), and/or may increase a rate of polymer buildup along the sidewalls 21 adjacent the levels 14b and 16b during the formation of the opening 22. In some embodiments, the dopant(s) provided within the substances 18b and 20b may include one or more of sulfur, silicon, etc. If the substance 18b comprises $SiO_x$ (where x is a number), and the dopant comprises silicon, then the silicon concentration within the substance 18b may be greater than the silicon concentration within stoichiometric silicon dioxide (i.e., the substance 18b may comprise $SiO_x$, where x is less than 2). If the substance 20b comprises silicon nitride, and the dopant comprises silicon, then the silicon concentration within the substance 20b may be greater than the silicon concentration within stoichiometric silicon nitride (i.e., greater than the silicon concentration within $Si_3N_4$).

The dopant(s) utilized within the substances 18a, 18b, 20a and 20b may be any of those described above with reference to FIGS. 7 and 8. Accordingly, such dopant(s) may include one or more elements selected from Groups 13-16 of the Periodic Table.

The first levels 14a, 14b and 14c may be considered to all comprise the same primary composition as one another, but to be compositionally different from one another due to differences in dopant(s) that may or may not be dispersed within such levels. Similarly, the second levels 16a, 16b and 16c may be considered to all comprise the same primary composition as one another, but to be compositionally different from one another due to differences in dopant(s) that may or may not be dispersed within such levels.

In some embodiments, the stack 12 of FIG. 11 may be considered to include the vertically-displaced regions 32, 34 and 36. The regions 32, 34 and 36 may be considered to be a first region, a second region and a third region, respectively. The substances 18a and 20a of the first region 32 may be considered to comprise first and second dopants, respectively; and the substances 18b and 20b of the second region 34 may be considered to comprise third and fourth dopants, respectively. The third dopant (i.e., the dopant within the substance 18b) is different than the first dopant (i.e., the dopant within the substance 18a), and the fourth dopant (i.e., the dopant within the substance 20b) is different than the second dopant (i.e., the dopant within the substance 20a). In some embodiments, the first and second dopants may be the same as one another, and the third and fourth dopants may be the same as one another. In other embodiments, the first and second dopants may be different from one another, and/or the third and fourth dopants may be different from one another. In some embodiments, the substances 18b and 20b of the second region 34 may be considered to comprise the first and second dopants, respectively; and the substances 18c and 20c of the third region 36 may be considered to comprise third and fourth dopants, respectively (if the third region comprises dopants therein).

Although the stack 12 of FIG. 11 is shown comprising three vertically-displaced regions, in other embodiments the stack may comprise more than three vertically-displaced regions or fewer than three vertically-displaced regions. Generally, the stack will include at least two of the vertically-displaced regions.

The opening 22 of FIG. 11 may be formed with the same processing utilized to form the prior art opening of FIG. 10. However, the dopant(s) dispersed within various of the levels 14 and 16 may enable the opening 22 of FIG. 11 to be formed with a uniform width along the regions 26, 28 and 30, and may thereby enable the problematic variations in width of the prior art opening of FIG. 10 to be avoided.

Figure 12:
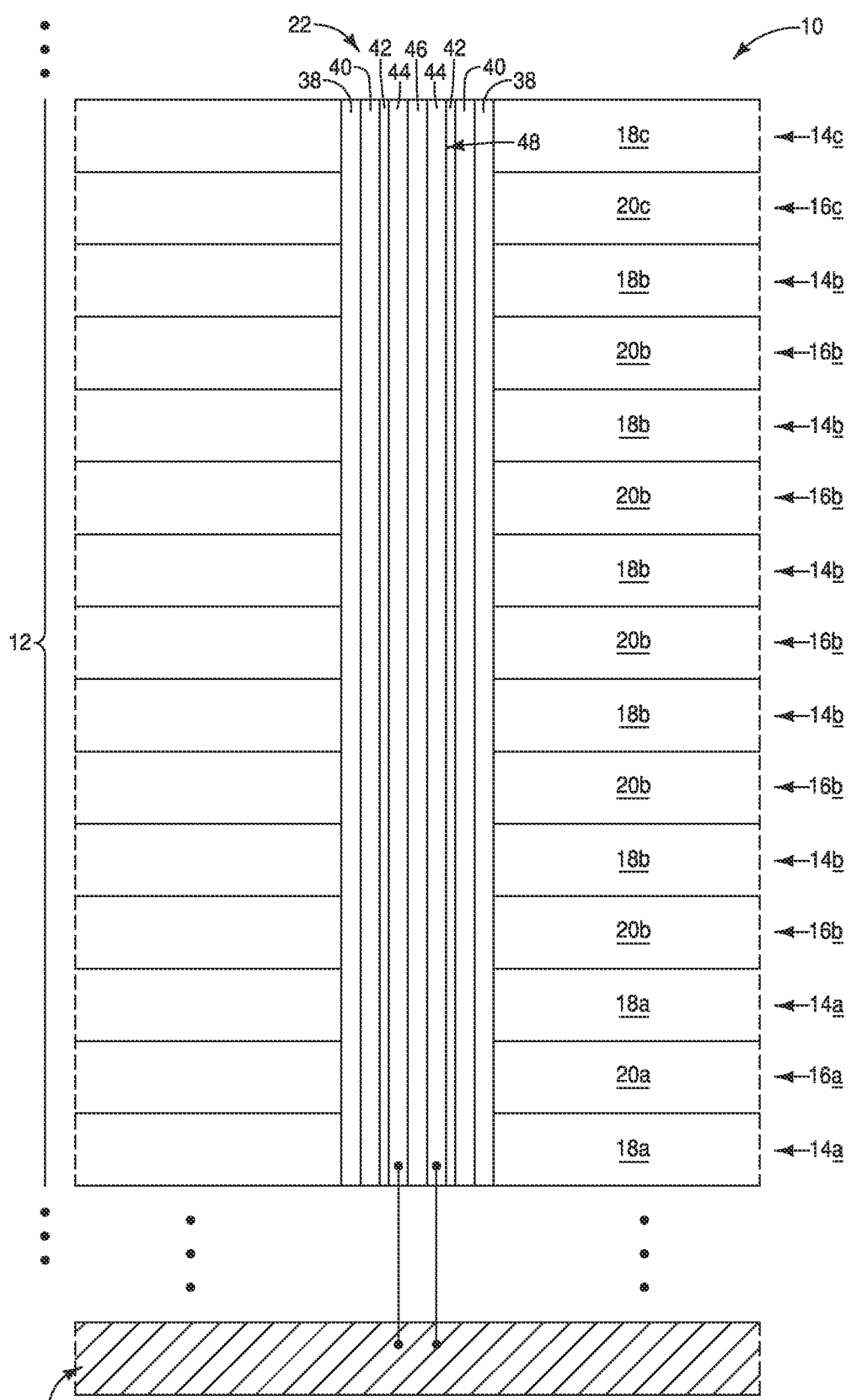

Referring to FIG. 12, charge-blocking material 38 is formed within the opening 22 to line the opening. The charge-blocking material 38 may comprise any suitable composition(s); and in some embodiments may comprise, consist essentially of, or consist of one or both of silicon oxynitride (SiON) and silicon dioxide ($SiO_2$).

Charge-storage material 40 is formed adjacent the charge-blocking material 38. The charge-storage material 40 may comprise any suitable composition(s). In some embodiments the charge-storage material 40 may comprise one or more charge-trapping materials, such as, for example, one or more of silicon nitride, silicon oxynitride, conductive nanodots, etc. For instance, in some embodiments the charge-storage material 40 may comprise, consist essentially of, or consist of silicon nitride.

Gate-dielectric material (i.e., tunneling material, charge-passage material) 42 is formed adjacent the charge-storage material 40. The gate-dielectric material 42 may comprise any suitable composition(s). In some embodiments, the gate-dielectric material 42 may comprise, for example, one or more of silicon dioxide, silicon nitride, silicon oxynitride, aluminum oxide, hafnium oxide, zirconium oxide, etc. The gate-dielectric material 42 may be bandgap-engineered to achieve desired electrical properties, and accordingly may comprise a combination of two or more different materials.

Channel material 44 is formed adjacent the gate-dielectric material 42, and extends vertically along (through) the stack 12. The channel material 44 comprises semiconductor material, and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

Insulative material 46 is formed adjacent the channel material 44, and fills a remaining portion of the opening 22. The insulative material 46 may comprise any suitable composition(s); and in some embodiments may comprise, consist essentially of, or consist of silicon dioxide.

In the illustrated embodiment of FIG. 12, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

The channel material 44 is shown to be electrically coupled with the source structure 24 in the cross-sectional view of FIG. 12. Such electrical coupling may be accomplished with any suitable configuration. For instance, in some embodiments the channel material 44 may directly contact the source structure 24.

The channel material 44 may be considered to be configured as a channel-material-pillar 48, with such pillar being shown to extend vertically through the stack 12.

Figure 13:
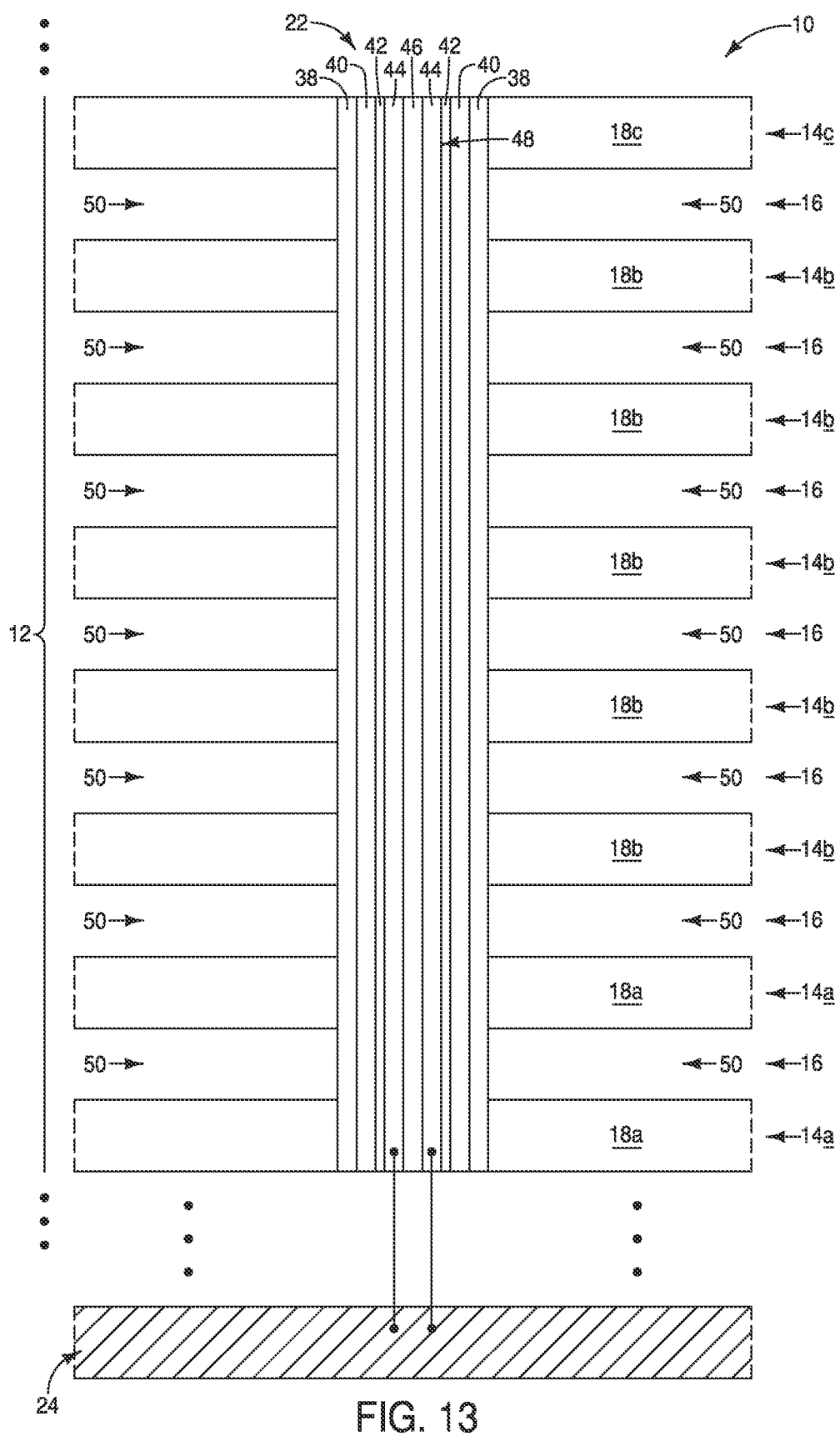

Referring to FIG. 13, the material 20 (FIG. 12) is removed to leave voids 50 along the second levels 16 (i.e., between the first levels 14). The material 20 may be removed with any suitable processing. In some embodiments the primary composition of material 20 is silicon nitride and the material is removed with an etch utilizing phosphoric acid.

Figure 14:
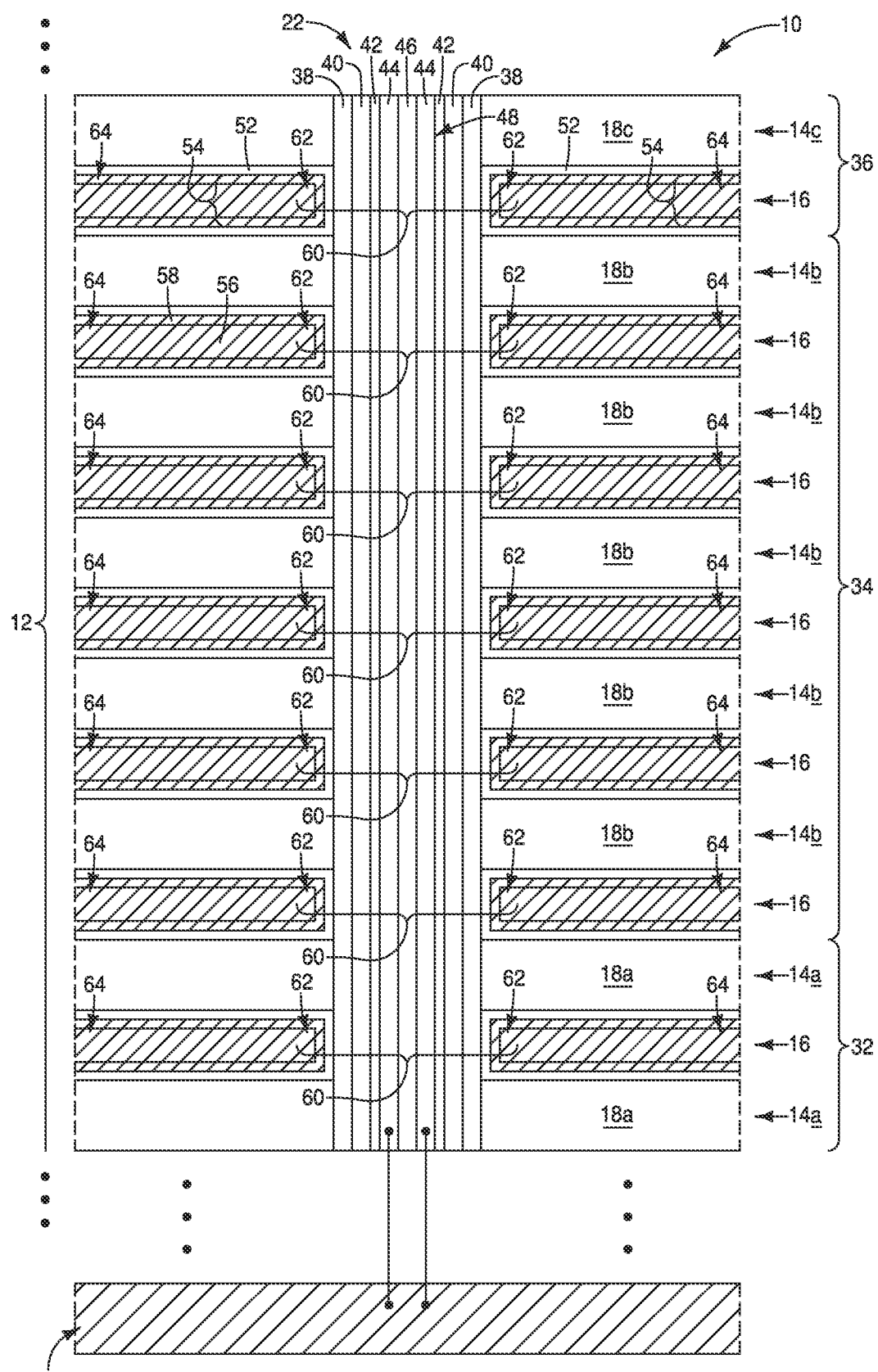

Referring to FIG. 14, high-k dielectric material (dielectric-barrier material) material 52 is formed within the voids 50 (FIG. 13) to line the voids. The term "high-k" means a dielectric constant greater than that of silicon dioxide. In some embodiments, the high-k dielectric material 52 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries. The high-k dielectric material 52 may be formed to any suitable thickness; and in some embodiments may be formed to a thickness within a range of from about 1 nm to about 5 nm.

Conductive structures 54 are formed within the lined voids. The conductive structures 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In the illustrated embodiment, the conductive structures include a conductive core material 56 and a conductive liner material 58 extending along an outer periphery of the core material 56. In some embodiments, the conductive core material 56 may comprise, consist essentially of, or consist of tungsten, and the conductive liner material 58 may comprise, consist essentially of, or consist of one or both of titanium nitride and tungsten nitride. In some embodiments, the conductive core material 56 may be referred to as a tungsten-containing-core-material, and the conductive liner material 58 may be referred to as a metal-nitride-containing-liner-material.

The stack 12 may be considered to be a stack of alternating insulative levels 14 and conductive levels 16 at the process stage of FIG. 14. The insulative levels 14 are subdivided amongst the three regions 32, 34 and 36, with such regions comprising the insulative materials 18a, 18b and 18c, respectively.

The conductive levels 16 may be considered to be memory cell levels (also referred to herein as wordline levels) of a NAND configuration. The NAND configuration includes strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. The stack 12 is indicated to extend vertically beyond the illustrated region to show that there may be more vertically-stacked levels than those specifically illustrated in the diagram of FIG. 14.

NAND memory cells 60 comprise the dielectric-barrier material 52, the charge-blocking material 38, the charge-storage material 40, the gate-dielectric material 42 and the channel material 44. The illustrated NAND memory cells 60 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 60 includes a control gate region 62 within a conductive structure 54 along a conductive level 16. The control gate regions 62 comprise control gates analogous to those described above with reference to FIGS. 1-4. The conductive structures 54 also comprise regions 64 adjacent to (proximate) the control gate regions 62. The regions 64 may be referred to as routing regions (wordline regions).

Figure 15:
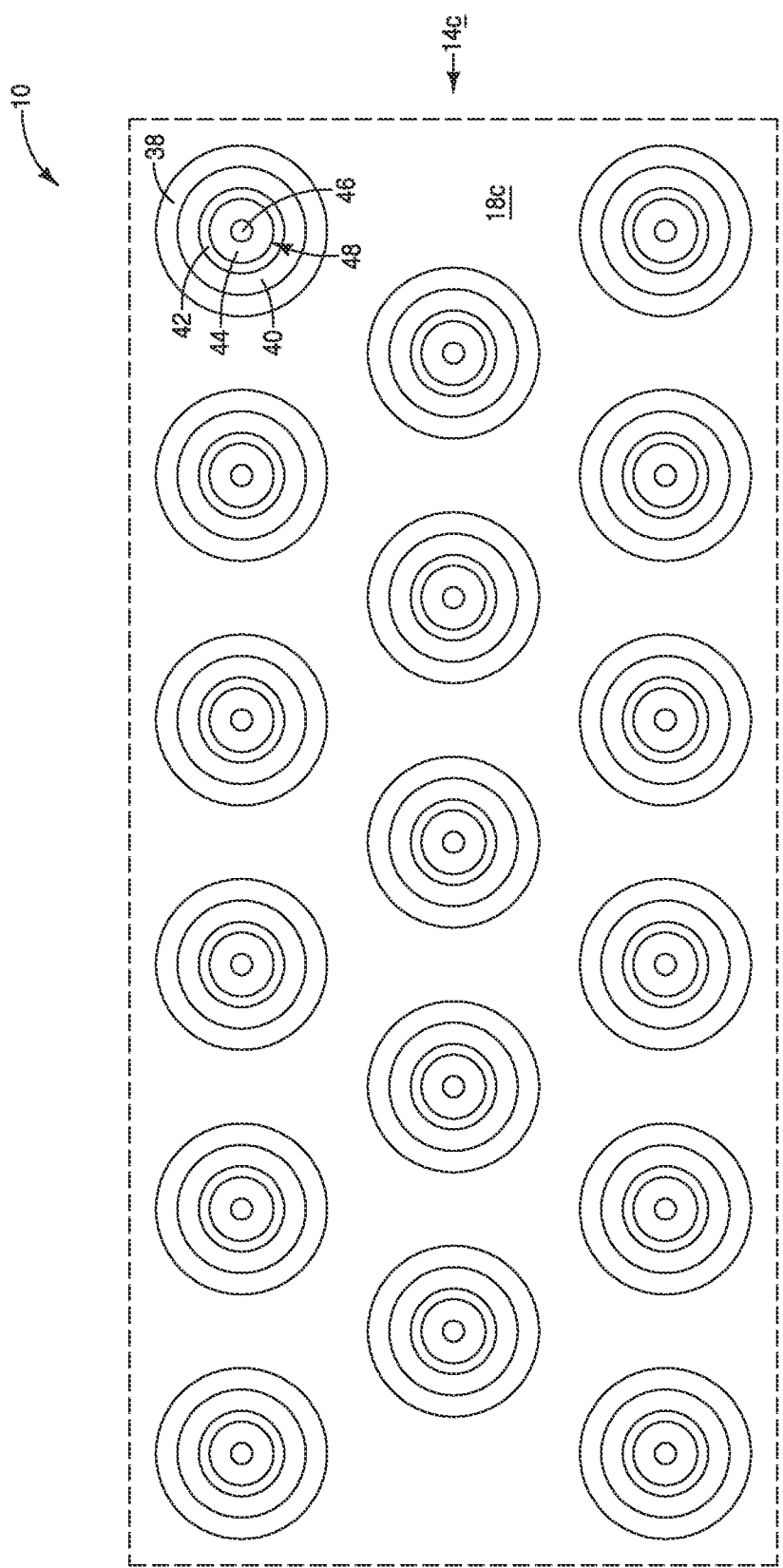
FIG. 15 is a top-down view of a region of an integrated assembly.

FIG. 15 shows a top-down view along the level 14c, and shows that the illustrated channel-material-pillar 48 of FIG. 14 is representative of a plurality of channel-material-pillars formed along the assembly 10. The channel-material-pillars may be tightly packed, and in the illustrated embodiment are substantially hexagonal-close-packed. The methodology described herein may enable the channel-material-pillars to be highly integrated, in that it may eliminate wide regions, twists, bends, etc., that may result when openings are formed through large stacks with conventional methods (e.g., the prior art methodology described above with reference to FIG. 10).

Although the opening described above with reference to FIGS. 11-14 is utilized for fabrication of channel-material-pillars, it is to be understood that the methodology described herein may be utilized for forming other configurations extending through large stacks of material. For instance, the methodology described herein may be utilized for forming slits, trenches, etc.; and/or for forming openings associated with other applications besides the illustrated application pertaining to NAND memory.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a vertical stack of alternating insulative levels and conductive levels. The insulative levels have a same primary composition as one another. At least one of the insulative levels is compositionally different relative to others of the insulative levels due to said at least one of the insulative levels including dopant dispersed within the primary composition. An opening extends vertically through the stack.

Some embodiments include an integrated assembly, comprising a vertical stack of alternating first and second levels. The second levels comprise a different composition than the first levels. The first levels comprising a same first primary composition as one another. At least one of the first levels is compositionally different relative to others of the first levels due to said at least one of the first levels comprising first dopant dispersed within the first primary composition. The second levels comprising a same second primary composition as one another. At least one of the second levels is compositionally different relative to others of the second levels due to said at least one of the second levels comprising second dopant dispersed within the second primary composition. An opening extends vertically through the stack.

Some embodiments include a method of forming an integrated assembly. A stack of alternating first and second levels is formed. The first levels comprise first material having a first primary composition, and the second levels comprise second material having a second primary composition. At least one of the first levels is compositionally different relative to others of the first levels due to said at least one of the first levels comprising first dopant dispersed within the first primary composition. At least one of the second levels is compositionally different relative to others of the second levels due to said at least one of the second levels comprising second dopant dispersed within the second primary composition. An opening is formed to extend through the first and second levels of the stack. Charge-storage material, tunneling material and channel material are formed within the opening. The second material is removed to leave voids between the first levels. Conductive structures are formed within the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a stack of alternating first and second levels; the first levels comprising first material having a first primary composition, and the second levels comprising second material having a second primary composition; at least one of the first levels being compositionally different relative to others of the first levels due to said at least one of the first levels comprising first dopant dispersed within the first primary composition; at least one of the second levels being compositionally different relative to others of the second levels due to said at least one of the second levels comprising second dopant dispersed within the second primary composition;
    forming an opening to extend through the first and second levels of the stack;
    forming charge-storage material, tunneling material and channel material within the opening;
    removing the second material to leave voids between the first levels; and
    forming conductive structures within the voids.

2. The method of claim 1 wherein the first and second dopants are the same as one another.

3. The method of claim 1 wherein the first and second dopants are different relative to one another.

4. The method of claim 1 further comprising forming dielectric-barrier material within the voids to line the voids, and then forming the conductive structures within the lined voids.

5. The method of claim 1 wherein the first primary composition comprises silicon dioxide and the second primary composition comprises silicon nitride.

6. The method of claim 1 wherein the first and second dopants include one or more elements selected from Groups 13-16 of the Periodic Table.

7. The method of claim 6 wherein the first and second dopants include one or more of Al, Ga, Ge, C, Se, S, Sn, Te, P, As and Sb.

8. The method of claim 6 wherein the first and second dopants include one or more fluorocarbons.

9. The method of claim 1 wherein:
    the stack includes at least two vertically-displaced regions, one of said two regions being a first region and the other of said two regions being a second region;
    the first and second dopants are within the first region;
    third dopant is dispersed within the first primary composition in the second region, with the third dopant being different than the first dopant; and
    fourth dopant is dispersed within the second primary composition in the second region, with the fourth dopant being different than the second dopant.

10. The method of claim 9 wherein:
    the first and second dopants are the same as one another; and
    the third and fourth dopants are the same as one another.

* * * * *